United States Patent
Liem et al.

(10) Patent No.: US 12,243,322 B2
(45) Date of Patent: Mar. 4, 2025

(54) GENERATION OF TEST DATA FOR TESTING A CONTROL SYSTEM OF A MOTOR VEHICLE WHICH EVALUATES A SENSOR DATA STREAM

(71) Applicant: dSPACE GmbH, Paderborn (DE)

(72) Inventors: Kusnadi Liem, Paderborn (DE); Norbert Meyer, Paderborn (DE)

(73) Assignee: dSPACE GMBH, Paderborn (DE)

( * ) Notice: Subject to any disclaimer, the term of this patent is extended or adjusted under 35 U.S.C. 154(b) by 105 days.

(21) Appl. No.: 18/084,647

(22) Filed: Dec. 20, 2022

(65) Prior Publication Data
US 2023/0196786 A1    Jun. 22, 2023

(30) Foreign Application Priority Data

Dec. 21, 2021 (EP) .................................... 21216219

(51) Int. Cl.
*G06V 20/56* (2022.01)
*G06F 3/01* (2006.01)
*G06F 9/455* (2018.01)

(52) U.S. Cl.
CPC ............. *G06V 20/56* (2022.01); *G06F 3/011* (2013.01); *G06F 9/455* (2013.01)

(58) Field of Classification Search
CPC ........ G06V 20/56; G09B 9/04; G01S 13/931; G01S 7/4052; G06F 11/3664; G06F 11/3684; G06F 17/40; G06F 3/011; G06F 30/15; G06F 30/20; G06F 9/455
See application file for complete search history.

(56) References Cited

U.S. PATENT DOCUMENTS

| | | |
|---|---|---|
| 6,253,144 B1 | 6/2001 | Yamamura et al. |
| 2016/0210383 A1* | 7/2016 | Alaniz ..................... G09B 9/05 |
| 2019/0155291 A1 | 5/2019 | Heit et al. |

(Continued)

FOREIGN PATENT DOCUMENTS

| | | |
|---|---|---|
| DE | 19928988 A1 | 1/2000 |
| DE | 102016100492 A1 | 7/2016 |

OTHER PUBLICATIONS

Weidemann, Christoph: "State-of-the-Art Railway Vehicle Design with Multi-Body Simulation" *Journal of Mechanical Systems for Transportation and Logistics*, vol. 3, No. 1, 2010.

(Continued)

*Primary Examiner* — Md N Haque
(74) *Attorney, Agent, or Firm* — Muncy, Geissler, Olds & Lowe, P.C.

(57) ABSTRACT

A computer-implemented method for generating test data for testing a control system of a motor vehicle which evaluates a sensor data stream. Simulated driving is performed through at least part of a virtual simulation environment with a virtual vehicle carrying a virtual sensor by specifying a translational movement of the virtual vehicle in the virtual simulation environment, wherein the virtual sensor has a visual field in which it detects the virtual simulation environment. Synthetic sensor data is generated with the virtual sensor by detecting the virtual simulation environment driven through by the virtual vehicle in the visual field of the virtual sensor. The synthetic sensor data is provided as test data for testing a control system of a motor vehicle which evaluates a sensor data stream.

14 Claims, 3 Drawing Sheets

(56) References Cited

U.S. PATENT DOCUMENTS

2019/0291743 A1* 9/2019 Druml .................. G01S 17/931
2019/0347525 A1* 11/2019 Liem ...................... G06V 20/56
2020/0082248 A1   3/2020 Villegas et al.
2020/0339109 A1* 10/2020 Hong .................... B60W 30/08
2020/0378870 A1  12/2020 Wang

OTHER PUBLICATIONS

Mitrev; "Mathematical modelling of translational motion of rail-guided cart with suspended payload", Journal of Zhejiang University Science A; Mar. 15, 2007.

Jeong et al; "Equations of motion for train derailment dynamics"; Proceedings of the 2007 ASME Rail Transportation Division Fall Technical Conference; Sep. 11-12, 2007.

Tuononen; "Vehicle Lateral State Estimation Based on Measured Tyre Forces"; Sensors 2009, 9, Laboratory of Automotive Engineering, Helsinki University of Technology; Oct. 30, 2009.

* cited by examiner

GENERATION OF TEST DATA FOR TESTING A CONTROL SYSTEM OF A MOTOR VEHICLE WHICH EVALUATES A SENSOR DATA STREAM

This nonprovisional application claims priority under 35 U.S.C. § 119(a) to European Patent Application No. 21216219, which was filed in Europe on Dec. 21, 2021, and which is herein incorporated by reference.

BACKGROUND OF THE INVENTION

Field of the Invention

The present invention relates to a computer-implemented method for generating test data for testing a control system of a motor vehicle which evaluates a sensor data stream, comprising the following method steps: simulated driving through at least part of a virtual simulation environment with a virtual vehicle carrying a virtual sensor by specifying a translational movement of the virtual vehicle in the virtual simulation environment, wherein the virtual sensor has a visual field in which it detects the virtual simulation environment; generating synthetic sensor data with the virtual sensor by detecting the virtual simulation environment driven through by the virtual vehicle in the visual field of the virtual sensor; and providing the synthetic sensor data as test data for testing a control system of a motor vehicle which evaluates a sensor data stream.

Description of the Background Art

The invention is relevant for the technical field of developing and testing driver assistance systems for autonomous driving or semi-autonomous driving of a motor vehicle. A motor vehicle suitable for autonomous or semi-autonomous driving generally has a sensor system for detecting objects in the vicinity of the vehicle and is at least partially controlled by signals detected by the sensor system. Corresponding sensors of such a sensor system of the motor vehicle are generally ultrasonic sensors, LiDAR sensors, radar sensors and/or cameras with which the environment of the motor vehicle is detected in order to achieve autonomous or at least semi-autonomous driving of the test vehicle. Corresponding sensor systems are also systems for receiving data from other vehicles or stationary devices of road traffic in order to achieve autonomous or at least partially autonomous driving of the vehicle by evaluating the data (Car2X (V2X) communication).

With autonomous driving, the driver no longer has to intervene in the driving process, at least over long distances. In the semi-autonomous process, it is at least such that the vehicle reacts automatically, i.e., without intervention by the driver, to certain traffic situations and thus avoids, for example, a collision with a slower vehicle in front by automatically initiating braking when approaching the vehicle in front. In order to be able to perform such automated driving maneuvers, the sensors of the sensor system are used in order to detect where other vehicles, pedestrians or other obstacles are located in the vicinity of the vehicle.

Before a vehicle equipped with a corresponding sensor system can be operated for semi-autonomous or autonomous driving in practice, i.e., on the real road network, a large number of tests must be carried out to ensure that the semi-autonomous or autonomous driving is actually reliable and safe. It is true that such tests, typically at an advanced stage, are also carried out on public roads with real vehicles. In advance, however, tests are usually carried out in the form of simulations with a virtual vehicle moving in a virtual three-dimensional simulation environment. In order to check the reaction of the sensor system for a large number of different, even unforeseen, situations, it is desirable to carry out such tests randomly and as realistically as possible.

SUMMARY OF THE INVENTION

It is therefore an object of the present invention to provide a way to obtain, in the context of a simulation, such test data for supplying a control unit to be tested, which deviate as little as possible from data that would have been obtained by means of a real system.

According to an exemplary embodiment of the invention, a computer-implemented method for generating test data for testing a control system of a motor vehicle which evaluates a sensor data stream is thus provided, which comprises the following method steps: simulated driving through at least part of a virtual simulation environment with a virtual vehicle carrying a virtual sensor by specifying a translational movement of the virtual vehicle in the virtual simulation environment, wherein the virtual sensor has a visual field in which it detects the virtual simulation environment; generating synthetic sensor data with the virtual sensor by detecting the virtual simulation environment driven through by the virtual vehicle in the visual field of the virtual sensor; and providing the synthetic sensor data as test data for testing a control system of a motor vehicle which evaluates a sensor data stream, wherein in the step of driving through at least a part of the virtual simulation environment with the virtual vehicle carrying the virtual sensor, at least one vehicle dynamic movement caused by the translational movement of the virtual vehicle is determined, wherein the vehicle dynamic movement comprises a pitch and/or a yaw and/or a roll and/or a vertical movement of the virtual vehicle, and in the step of generating the synthetic sensor data with the virtual sensor, the change in the visual field of the virtual sensor caused by the simulated vehicle dynamic movement of the virtual vehicle is taken into account, in which the virtual sensor detects the virtual simulation environment driven through by the virtual vehicle.

The present invention thus also takes into account the dynamics of the vehicle and at least one associated movement in the simulation. For this purpose, the forces acting on the vehicle must be determined. In order to define these precisely, it is customary to use a coordinate system for the motor vehicle. The introduction of such a vehicle coordinate system defines a direction for forces, torques, speeds and distances. For example, this coordinate system is placed in the center of gravity of the vehicle, with the x-axis pointing in the direction of travel and the z-axis pointing upwards. The coordinate system is usually right-handed, so that the y-axis points to the left in the direction of travel. A movement in the x-direction is a longitudinal movement. If the vehicle moves in the y-direction, this is referred to as pushing. A movement in the z-direction is a lifting movement, hereinafter also referred to as vertical movement.

On a moving vehicle, however, not only directional movements, but also torques around the above-mentioned three coordinate axes can occur. In a motor vehicle, a movement around the x-axis is called roll, a movement around the y-axis is called pitch, and a movement around the z-axis is called yaw. In driving dynamics, there are therefore six degrees of freedom, namely three translational (longitudinal movement, pushing, vertical movement) and three rotational (yaw, pitch and roll). According to the invention, a translational movement of the virtual vehicle on a virtual road in the x and y direction is specified and the movements in at least one of the four other degrees of freedom are determined on the basis of the predetermined translational movement of the virtual vehicle.

The determination of such vehicle dynamic movements on the basis of a predetermined translational movement is well known to those skilled in the art from practice and therefore requires no further explanation in the present case. As an example, reference shall be made to the document "Christoph WEIDEMANN, State-of-the-Art Railway Vehicle Design with Multi-Body Simulation, Journal of Mechanical Systems for Transportation and Logistics, Vol. 3, No. 1, 2010".

Decisive for the invention is now that in the step of generating synthetic sensor data with the virtual sensor, the change in the visual field of the virtual sensor caused by the simulated vehicle dynamic movement of the virtual vehicle is taken into account. This makes it possible to take vehicle dynamics into account when generating the test data for testing the control system, which can be of particular interest in extreme situations, such as strong braking, where the sensor tilts forward due to the pitch of the vehicle in such a way that the vehicle's surroundings are only detectable in an area slightly closer to the vehicle than before, i.e., during a normal journey of the vehicle.

Basically, the virtual sensor can be the simulation of various sensors carried on a motor vehicle. According to a preferred development of the invention, however, it is provided that the virtual sensor is a virtual ultrasonic sensor, a virtual LiDAR sensor, a virtual radar sensor or a virtual camera. Of course, the invention also includes such situations in which a plurality of virtual sensors are carried on the virtual vehicle.

The virtual simulation can be designed in different ways. According to a preferred development of the invention, however, the virtual simulation environment is three-dimensional. It is particularly preferred that the three-dimensional virtual simulation environment comprises a virtual road with gradients on which the virtual vehicle drives. In this way, not only roll movements, pitch movements and yaw movements can occur, but also vertical movement of the vehicle.

According to an example, the following may be taken into account when determining the vehicle dynamic movement caused by the translational movement of the virtual vehicle: the mass of the virtual vehicle and/or the geometry of the virtual vehicle and/or the mass distribution of the virtual vehicle and/or the suspension of the virtual vehicle and/or the damping of the virtual vehicle. In particular, the more accurately the mass distribution of the virtual vehicle corresponds to the mass distribution of the real vehicle, the more realistically the movements of the vehicle can be simulated.

In principle, the virtual simulation environment could be created in real time as part of the simulation. However, it may also be provided that the virtual simulation environment is created in advance and stored on a non-transitory, computer-readable storage medium.

The attachment of the virtual sensor to the virtual vehicle can be flexible in principle. According to a preferred further development of the invention, however, it is provided that the virtual sensor is rigidly attached to the virtual vehicle. In this way, all movements of the virtual vehicle are transmitted directly to the virtual sensor.

The invention also relates to a non-transitory, computer-readable storage medium with synthetic sensor data stored thereon, which have been obtained by a method as described above.

In addition, the invention relates to a use of the synthetic sensor data stored on the non-transitory, computer-readable storage medium for testing a control system which evaluates a sensor data stream. Preferably, in such use, the control system which evaluates a sensor data stream is a driver assistance system for a motor vehicle or a component of such a driver assistance system, for example a perception algorithm or a neural network set up as a classifier.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
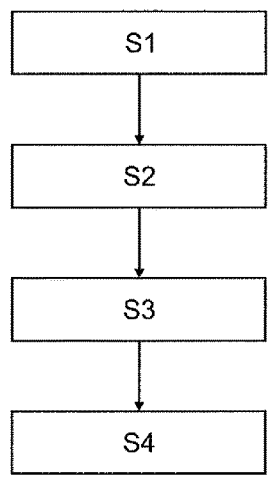
FIG. 1 schematically shows a method according to a preferred embodiment of the invention, FIG. 2a schematically shows normal driving of a virtual motor vehicle, and FIG. 2b schematically shows an emergency braking of a virtual motor vehicle.

FIG. 1 schematically shows a method according to a preferred embodiment of the invention. This is a computer-implemented method for generating test data for testing a control system of a motor vehicle which evaluates a sensor data stream.

In a first method step S1, a simulated driving through of at least a part of a three-dimensional virtual simulation environment with a virtual vehicle carrying a virtual sensor is carried out by specifying a translational movement of the virtual vehicle in the virtual simulation environment. The virtual simulation environment has been created in advance and stored on a non-volatile, computer-readable storage medium, e.g., on the hard disk of a simulation computer.

In the three-dimensional virtual simulation environment, the virtual vehicle travels on a virtual road with gradients. The virtual sensor has a visual field in which it captures the virtual simulation environment. Vehicle dynamic movements caused by the translational movement of the virtual vehicle are now determined, namely a pitch, a yaw, a roll and a vertical movement of the virtual vehicle.

In this case, the virtual sensor is a virtual LiDAR sensor that is rigidly connected to the virtual vehicle. The virtual sensor can also be a virtual ultrasonic sensor, a virtual radar sensor or a virtual camera. In determining the vehicle dynamic movement caused by the translational movement of the virtual vehicle, the mass of the virtual vehicle, the geometry of the virtual vehicle, the mass distribution of the virtual vehicle, the suspension of the virtual vehicle and the damping of the virtual vehicle are taken into account in the present case.

In step S2, synthetic sensor data is generated with the virtual sensor by detecting the virtual simulation environment driven through by the virtual vehicle in the visual field of the virtual sensor. This takes into account the change in the visual field of the virtual sensor caused by the simulated vehicle dynamic movements of the virtual vehicle, in which the virtual sensor detects the virtual simulation environment driven through by the virtual vehicle. The visual field of the virtual sensor is therefore not only given by the actual translational movement of the virtual vehicle within the simulation environment, but also by the vehicle dynamic movements. For example, cornering or braking or accelerating influences the visual field of the virtual sensor.

In step S3, the synthetic sensor data obtained are then provided as test data for testing a control system of a motor vehicle which evaluates a sensor data stream, namely by means of storage on a non-volatile, computer-readable storage medium, such as the hard disk of the simulation computer.

Finally, in step S4, the synthetic sensor data stored on the non-volatile, computer-readable storage medium are used to test a control system which evaluates a sensor data stream or a component thereof. In the present case, the control system which evaluates a sensor data stream is a driver assistance system for a motor vehicle, so that, as explained above, it can be tested under quasi-real conditions before its real use.

In the step of generating the synthetic sensor data with the virtual sensor, the change in the visual field of the virtual sensor caused by the simulated vehicle dynamic movement of the virtual vehicle is taken into account, which is particularly helpful in extreme driving situations. In the case of strong acceleration, strong braking but also when rolling in curves, there can be a considerable change in the visual field of the sensor attached to a vehicle. This is shown schematically in FIGS. 2a and 2b.

Figure 2A:
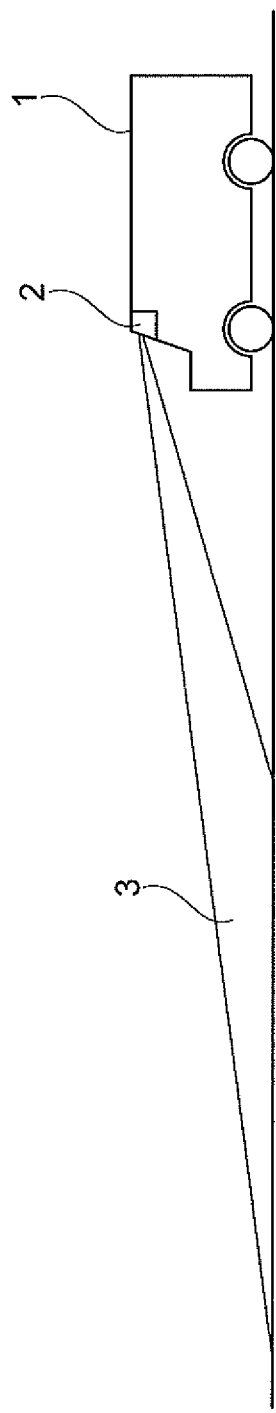
Figure 2B:
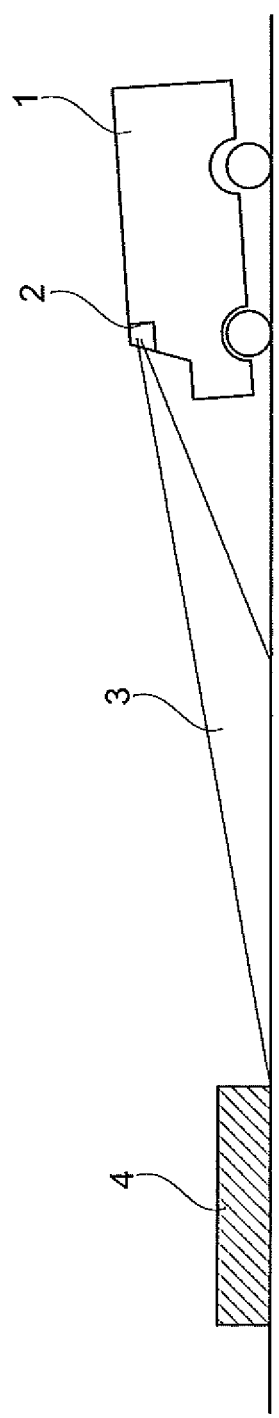

FIG. 2a shows an unaccelerated journey of a virtual vehicle 1, i.e., a journey at constant speed. A virtual sensor 2 attached to the virtual vehicle 1 has a predetermined visual field 3 with which a certain area in front of the virtual vehicle 1 is detected. If there is a strong braking of the virtual vehicle 1, as in emergency braking shown in FIG. 2b, the visual field 3 of the virtual sensor 2 changes. Due to the pitch of the virtual vehicle 1, the virtual sensor 2 also tilts forward, so that the environment of the virtual vehicle 1 is now only detected in an area slightly closer to the virtual vehicle 1 than before during the unaccelerated drive of the virtual vehicle 1. The area 4 which is no longer detected during braking is shown hatched in FIG. 2b. For the driving safety simulation, considering this changed visual field 3 of the virtual sensor 2 can be very helpful.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A computer-implemented method for generating test data for testing a control system of a motor vehicle which evaluates a sensor data stream, the method comprising:
   simulated driving through at least part of a virtual simulation environment with a virtual vehicle carrying a virtual sensor by specifying a translational movement of the virtual vehicle in the virtual simulation environment, the virtual sensor having a visual field in which it detects the virtual simulation environment;
   generating synthetic sensor data with the virtual sensor by detecting the virtual simulation environment driven through by the virtual vehicle in the visual field of the virtual sensor; and
   providing the synthetic sensor data as test data for testing a control system of a motor vehicle which evaluates a sensor data stream,
   wherein, in the step of driving through at least a part of the virtual simulation environment with the virtual vehicle carrying the virtual sensor, at least one vehicle dynamic movement is determined by the translational movement of the virtual vehicle,
   wherein the vehicle dynamic movement comprises a pitch and/or a yaw and/or a roll and/or a vertical movement of the virtual vehicle, and
   wherein, in the step of generating the synthetic sensor data with the virtual sensor, a change in the visual field of the virtual sensor caused by a simulated vehicle dynamic movement of the virtual vehicle is taken into account in that the virtual sensor detects the virtual simulation environment driven through by the virtual vehicle, such that the visual field is provided by an actual translational movement of the virtual vehicle and the simulated vehicle dynamic movement of the virtual vehicle.

2. The computer-implemented method according to claim 1, wherein the virtual sensor is a virtual ultrasonic sensor, a virtual LiDAR sensor, a virtual radar sensor or a virtual camera.

3. The computer-implemented method according to claim 1, wherein a plurality of virtual sensors is carried on the virtual vehicle.

4. The computer-implemented method according to claim 1, wherein the virtual simulation environment is three-dimensional.

5. The computer-implemented method according to claim 4, wherein the three-dimensional virtual simulation environment comprises a virtual road with gradients on which the virtual vehicle drives.

6. The computer-implemented method according to claim 1, wherein, when determining the vehicle dynamic movement caused by the translational movement of the virtual vehicle, the following is taken into account: the mass of the virtual vehicle and/or the geometry of the virtual vehicle and/or the mass distribution of the virtual vehicle and/or the suspension of the virtual vehicle and/or the damping of the virtual vehicle.

7. The computer-implemented method according to claim 1, wherein the virtual simulation environment is created in advance and stored on a non-transitory, computer-readable storage medium.

8. The computer-implemented method according to claim 1, wherein the virtual sensor is rigidly attached to the virtual vehicle.

9. A non-transitory, computer-readable storage medium with synthetic sensor data stored thereon, obtained by the method according to claim 1.

10. The computer-implemented method according to claim 1, wherein the synthetic sensor data stored on a non-transitory, computer-readable storage medium is for testing a control system which evaluates a sensor data stream.

11. The computer-implemented method according to claim 10, wherein the control system, which evaluates a sensor data stream, is a driver assistance system for a motor vehicle.

12. The computer-implemented method according to claim 1, wherein the vehicle dynamic movement comprises the pitch, the yaw, the roll and the vertical movement of the virtual vehicle.

13. The computer-implemented method according to claim 1, wherein the dynamic movement of the vehicle, which causes the change in the visual field, comprises a cornering, a braking or an accelerating.

14. The computer-implemented method according to claim 1, wherein, when determining the vehicle dynamic movement caused by the translational movement of the virtual vehicle, the following is taken into account: the mass of the virtual vehicle, the geometry of the virtual vehicle, the mass distribution of the virtual vehicle, the suspension of the virtual vehicle, and the damping of the virtual vehicle.

* * * * *